(12) United States Patent
Sarajlic

(10) Patent No.: US 12,013,415 B2
(45) Date of Patent: Jun. 18, 2024

(54) METHOD OF PROVIDING A MEMS DEVICE COMPRISING A PYRAMIDAL PROTRUSION, AND A MOLD

(71) Applicant: SMARTTIP BV, Enschede (NL)

(72) Inventor: Edin Sarajlic, Zutphen (NL)

(73) Assignee: SMARTTIP BV, Enschede (NL)

( * ) Notice: Subject to any disclaimer, the term of this patent is extended or adjusted under 35 U.S.C. 154(b) by 0 days.

(21) Appl. No.: 17/603,226

(22) PCT Filed: Apr. 7, 2020

(86) PCT No.: PCT/NL2020/050237
§ 371 (c)(1),
(2) Date: Oct. 12, 2021

(87) PCT Pub. No.: WO2020/209716
PCT Pub. Date: Oct. 15, 2020

(65) Prior Publication Data
US 2022/0187336 A1  Jun. 16, 2022

(30) Foreign Application Priority Data

Apr. 12, 2019  (NL) ..................................... 2022939

(51) Int. Cl.
*G01Q 70/16* (2010.01)
*G01Q 70/10* (2010.01)

(52) U.S. Cl.
CPC ............. *G01Q 70/10* (2013.01); *G01Q 70/16* (2013.01); *B81B 2201/12* (2013.01)

(58) Field of Classification Search
CPC .................................................... G01Q 70/16
See application file for complete search history.

(56) References Cited

U.S. PATENT DOCUMENTS

| | | | |
|---|---|---|---|
| 8,701,211 B2 | 4/2014 | Moldovan | |
| 2006/0003493 A1 | 1/2006 | Milligan et al. | |
| 2007/0154354 A1* | 7/2007 | Faris | G01Q 70/16 |
| | | | 850/60 |

OTHER PUBLICATIONS

Zawierta et al. 'A High Deposition Rate Amorphous-Silicon Process for Use as a Thick Sacrificial Layer in Surface-Micromachining' Apr. 2017, Journal of Microelectromechanical Systems, vol. 26, pp. 406-414 (Year: 2017).*

(Continued)

*Primary Examiner* — Eliza W Osenbaugh-Stewart
(74) *Attorney, Agent, or Firm* — Brooks Kushman P. C.; John E. Nemazi

(57) ABSTRACT

A method of providing a MEMS device, such as an AFM probe, having a three-sided pyramidal protrusion is made using a multitude of MEMS method steps. To allow the reliable and speedy manufacture of such a MEMS device having a three-sided protrusion on a massive scale, wherein the protrusion has a relatively small half-cone angle and a single apex, a mold is used. The mold includes a sacrificial layer on top of a base substrate. The method of providing the MEMS device includes:
 providing an area at the first side of the mold which area comprises a pit with a layer of protrusion material,
 patterning the layer of protrusion material to the desired shape, and
 isotropically etching the sacrificial layer of the mold with an isotropic etchant capable of etching the sacrificial layer so as to separate the MEMS device from at least the base substrate of the mold.

15 Claims, 12 Drawing Sheets

(56) References Cited

OTHER PUBLICATIONS

Figure 2C:
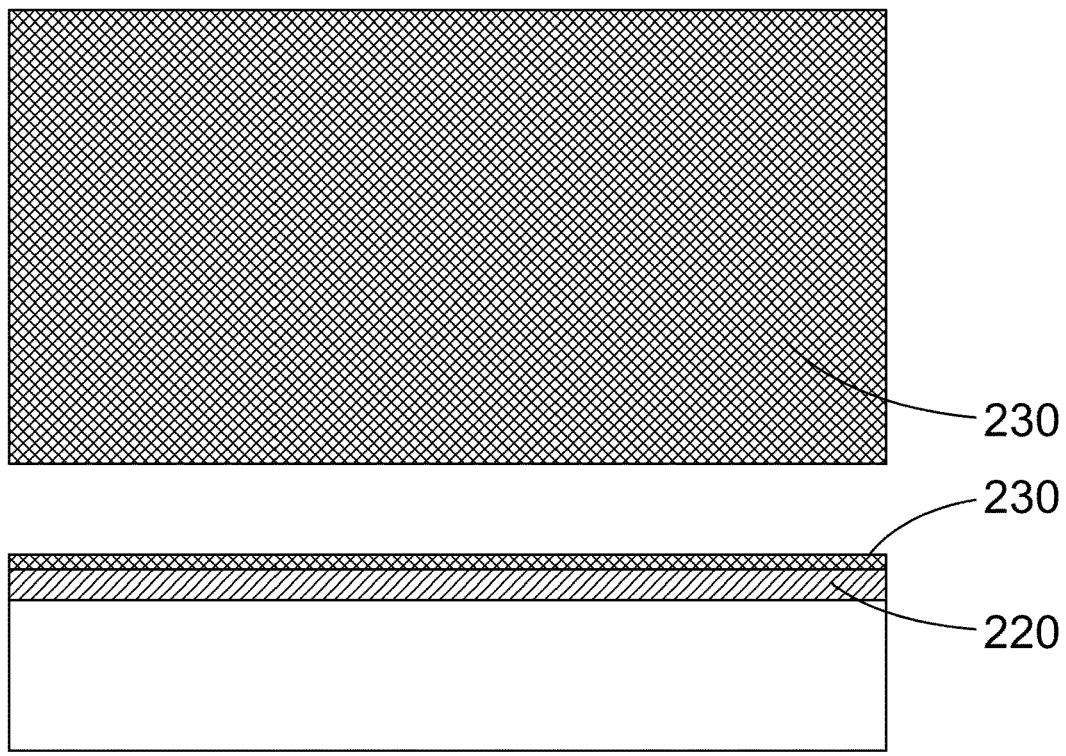

Vermeer Rolf et al: "Fabrication of novel AFM probe with high-aspect-ratio ultra-sharp three-face silicon nitride tips", 14th IEEE International Conference on Nanotechnology, IEEE, Aug. 18, 2014 (Aug. 18, 2014).
N. Moldovan et al.: "Advances in Manufacturing of Molded Tips for Scanning Probe Microscopy", Journal of Microelectromechanical Systems, vol. 21, No. 2, Apr. 2012 (Apr. 1, 2012).
International Search Report for PCT/NL2020/050237 Prepared by the European Patent Office, mailing date Jul. 27, 2020, 4 pages.

* cited by examiner

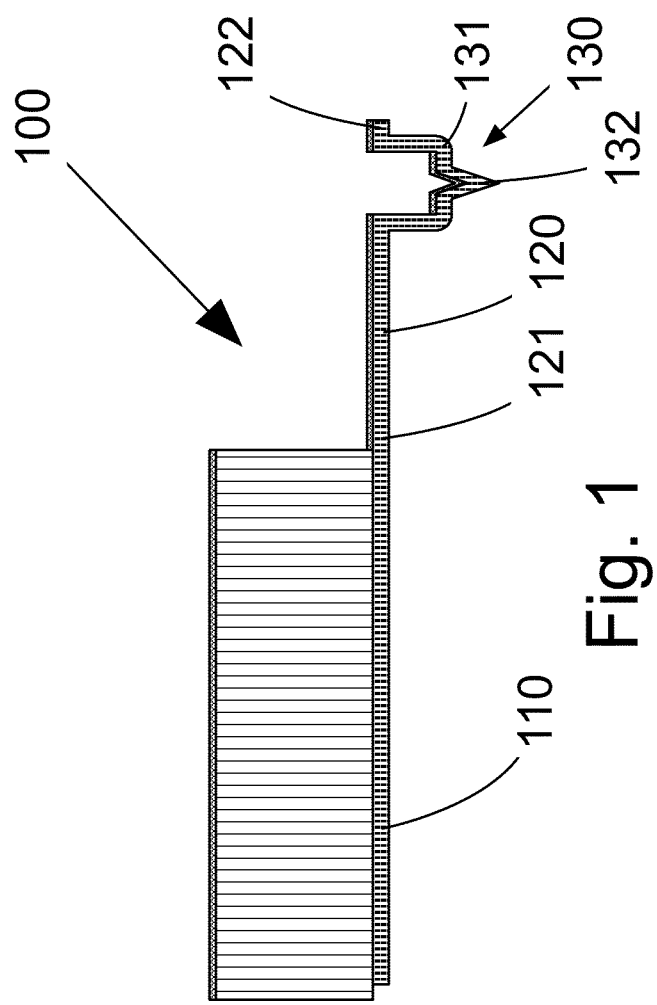

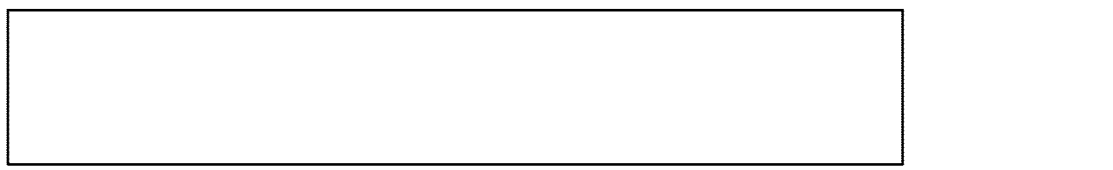
Fig. 2A
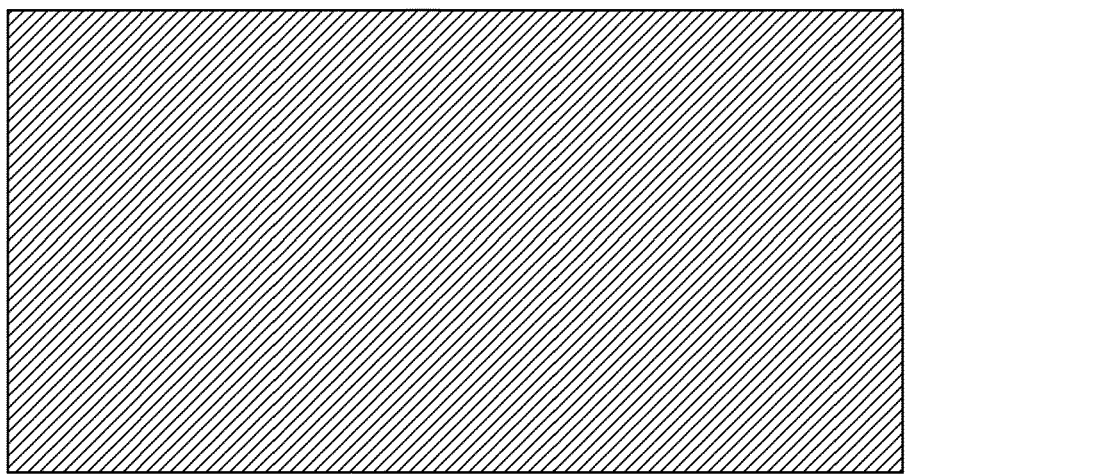
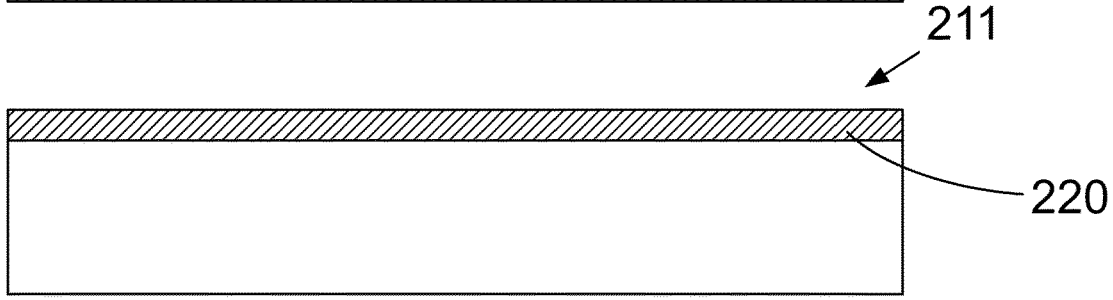
Fig. 2B

METHOD OF PROVIDING A MEMS DEVICE COMPRISING A PYRAMIDAL PROTRUSION, AND A MOLD

CROSS-REFERENCE TO RELATED APPLICATION

This application is the U.S. national phase of PCT Application No. PCT/NL2020/050237 filed on Apr. 7, 2020, which claims priority to NL Patent Application No. 2022939 filed on Apr. 12, 2019, the disclosures of which are incorporated in their entirety by reference herein.

The present invention relates to a method of providing a MEMS device comprising a three-sided pyramidal protrusion using a multitude of MEMS method steps.

In the art it is known to manufacture MEMS devices, wherein the MEMS device comprises a protrusion. The prototypical example of this is a probe, for example a probe used for scanning. These days, such probes are mass-produced using <100> silicon wafer as a base material using anisotropic etching.

For the manufacturing of pyramidal tips in general, two methods can be distinguished:
1) Silicon tip manufacturing wherein silicon etching results in the tip.
2) Tip molding, which is a well-known nanofabrication method for producing ultrasharp tips, such as those used in scanning probe microscopy (SPM) field emitters, vacuum electronics or tunneling-based devices. Tip molding consists of etching a pyramid-shaped pit into a sacrificial substrate (typically silicon), depositing the desired thin-film material into the mold, processing further to define other features in the deposited material such as a cantilever arm, and then removing the sacrificial substrate to reveal a pyramid-shaped tip. The most common mold geometry is a square (four-sided) pyramid etched into a <100> Si wafer via anisotropic etching.

The tip molding technique has several advantages:
1) The tip material can be chosen depending on the application. The material can be harder/more wear resistant than silicon. The tip material may also have different dielectric properties than silicon. The tip material may for example be silicon nitride, diamond, metal or polymer.
2) The cantilever properties can be controlled better. They may be smaller and/or softer cantilevers with more precisely defined stiffness (as the thickness of a molded probe is easier to control by deposition than by etching).
3) It is easier to integrate any active components on the MEMS device (probe). Examples of such active components are heaters, sensors, and actuators.

A disadvantage of the known methods is that the resulting protrusion with a pyramidal shape comprising four planes does not have one apex but two (each formed by three planes) or a ridge. In other words, the pyramidal tip is not as sharp as if there were a sole apex. This is referred to as a wedge in the article "Advances in Manufacturing of Molded Tips for Scanning Probe Microscopy" ([2012] N. Moldovan et al in JOURNAL OF MICROELECTROMECHANICAL SYSTEMS, VOL. 21, NO. 2, APRIL 2012, which discloses the manufacture of three-sided tips by etching Si (311) wafers to from pits defined by three <111> planes. The tips produced using this method have a relatively large cone angle, making them less suitable for scanning purposes such as AFM probes. This problem was addressed in "Advanced Micromachining Schemed for Scanning Probe Tips" (PhD Thesis Rolf Vermeer [2016]) and from the article "Fabrication of novel AFM probe with High-Aspect-Ratio Ultra-Sharp Three-Face Silicon Nitride Tips" (R. Vermeer et al in 14TH IEEE INTERNATIONAL CONFERENCE ON NANOTECHNOLOGY, IEEE, 18 Aug. 2014, pages 229-233, XP032690978, 001: 10.11 09/NAN0.2014.6967957), which discloses the use of <111> silicon for manufacturing a three-sided pyramidal tip for a probe. This process uses dry etching to remove the base material, adversely affecting the cost and speed of manufacturing.

The object of the present invention is to provide a method allowing the reliable and speedy manufacture of a MEMS device comprising a three-sided protrusion on a massive scale, wherein the protrusion has a relatively small half-cone angle and a single apex.

To this end, a method according to the preamble is characterized in that a mold is used, said mold
  defining a first side and a second side,
  comprising a base substrate, wherein at the first side of the mold the surface of the base substrate defines a main plane parallel with the first side, said main plane defining a <111> plane of monocrystalline silicon,
  comprising a sacrificial layer on top of the base substrate at the first side of the mold, said sacrificial layer being chosen from polycrystalline silicon and amorphous silicon;
  comprising a pit at the first side of the mold, said pit extending through the sacrificial layer [from page 3 lines 18-19 of the application as filed] into the base substrate, and
  comprising three wall sections parallel with <111> crystal planes, each of the three wall sections intersecting the other two wall sections, and
  comprising a vertex of a bottom section of the pit;
wherein the method of providing the MEMS device comprises
  providing an area at the first side of the mold which area extends from a first subarea outside the pit to a second subarea that comprises the vertex of the pit with a layer of protrusion material,
  patterning the layer of protrusion material to the desired shape, and
  isotropically etching the sacrificial layer of the mold with an isotropic etchant capable of etching the sacrificial layer so as to separate the MEMS device from at least the base substrate of the mold.

Thus a MEMS device comprising a protrusion can be produced comprising a sharp apex. The base substrate can be used to conveniently produce a multitude of MEMS devices comprising the protrusions.

Another advantage of the present method is that the device can be obtained without dissolving the whole silicon base material, which would be rather time consuming given that it is <111> oriented silicon.

A typical method will comprise further steps for finishing the MEMS device.

The pit will extend from the first through the sacrificial layer into the base substrate.

A method for fabricating a mass storage device including a probe is known from US 2006/003493 A1 wherein the probe has a cantilever having a first end region operatively connected to a substrate and a second end region rotated in a direction such that the second end region is opposed to the first end region. A tip is disposed on the second end region, with the tip pointing in a direction opposed to the first end region.

A method of producing sharp tips is known from U.S. Pat. No. 8,701,211 B2. The tips are formed by deposition into a mold(s) formed in a sacrificial crystalline semiconductor substrate with an exposed {311} surface which has been etched with a crystallographic etchant to form a 3-sided, trihedral or trigonal pyramidal mold(s) or indentation(s).

According to a favourable embodiment, the mold is prepared by subjecting an intermediate product to a plurality of method steps to form a mold, the intermediate product
defining a first side and a second side, and
comprising a base substrate, wherein at the first side of the intermediate product the surface of the base substrate defines a main plane parallel with the first side, said main plane defining a <111> plane of monocrystalline silicon;
wherein the plurality of method steps comprises the steps of
providing the base substrate of the intermediate product at the first side with a sacrificial layer of a first material, said first material being non-monocrystalline silicon,
providing the sacrificial layer of the intermediate product with a masking layer of a second material different from the first material,
providing the intermediate product with a blind hole extending from the first side into the base substrate,
subjecting the intermediate product to anisotropic etching of the silicon using an etchant that is capable of etching the sacrificial layer in any direction parallel to the main plane at a rate that is at least as great as the rate of anisotropic etching of the <111> crystal planes of the silicon base material layer, so as to form a pit comprising three pyramidal wall sections,
removing the masking layer of the second material,
providing the pit of the intermediate product with a molding layer with the molding layer forming a vertex of the pit defined by the three wall sections so as to form the mold.

Low Pressure Chemical Vapor Deposition (LPCVD) may be used to deposit a layer of polycrystalline silicon as the sacrificial layer. This will be etched isotropically with an anisotropic etchant such as TMAH or KOH for etching polycrystalline silicon and the <111> silicon base material.

The step of providing the pit with a molding layer may comprising depositing the molding layer or growing the molding layer.

Typically, the masking layer is removed before the step of providing the molding layer.

To form the blind hole, an opening may be created in the masking layer, typically a circular opening. Then the blind hole may be created by directional etching of the multilayer stack (such as silicon oxide, polycrystalline silicon and monocrystalline silicon), for example with a combination of Reactive Ion Etching (RIE) and Deep Reactive Ion Etching (DRIE) to obtain a blind hole with a wall transverse to the main plane. The depth of the blind hole determines the height of the protrusion, later on.

If the molding layer has not been removed upon separation of the MEMS device from the base material, this step will be performed to as to result in a MEMS device comprising a protrusion having a single apex.

A molding layer is typically relatively thin (e.g. 1 um) and as a large surface area is exposed this can be done relatively quickly, in contrast to the removal of the base material in the method of Vermeer (supra) which requires etching along the <111> plane, which is very time consuming.

In case of silicon oxide as the molding layer, it is advantageously removed by wet etching. A suitable etchant is Buffered HydroFluoric acid (BHF).

According to a favourable embodiment, the step of providing the molding layer comprises growing the molding layer.

This helps to define a very sharp apex of the final protrusion.

The molding layer may comprise silicon oxide, which is easy to grow from the silicon-based sacrificial layer and the <111> silicon.

According to a favourable embodiment, the step of subjecting the intermediate product to anisotropic etching of the silicon using an etchant that is capable of etching the sacrificial layer in any direction parallel to the main plane comprises etching at a rate that is greater than the rate of anisotropic etching of the <111> silicon base material layer so as to form the pit.

The pit formed comprises a tip base section that extends beyond (outside) planes defined by the pyramidal tip wall sections. In other words, a relatively broad tip base section is formed which is advantageous for the strength of the tip.

According to a favourable embodiment, after separation of the MEMS device and the mold, the molding layer is removed by etching.

A molding layer is typically relatively thin (e.g. 1 um) and as a large surface area is exposed this can be done relatively quickly, in contrast to the removal of the removal of (111) in the method of Vermeer (supra).

In case of silicon oxide as the molding layer, it is advantageously removed by wet etching. A suitable etchant is Buffered HydroFluoric acid (BHF).

According to a favourable embodiment, the masking layer is chosen from i) silicon nitride and ii) silicon oxide.

It is preferred that the molding layer is silicon oxide and the protrusion material is silicon nitride. Such a masking layer can easily be removed with buffered HF (BHF), while leaving the sacrificial layer and the silicon base material.

According to a favourable embodiment, the layer of protrusion material comprises a material chosen from i) silicon nitride, and ii) diamond.

These are hard materials that are excellent for creating sharp and wear-resistant protrusions.

According to a favourable embodiment, the layer of the protrusion material is formed as a stack of sublayers, wherein the method comprises providing a first sublayer of a first protrusion material followed by providing a second sublayer of a second protrusion material that is different from the first protrusion material.

Thus the properties of the protrusion can be tailored to the specific requirements for the MEMS device. The first sublayer may for example be diamond to provide a wear-resistant layer. The first sublayer may also be a metal to provide a conductive layer.

The second material may be for example silicon nitride to provide the tip and cantilever of a MEMS probe with the desired mechanical properties not afforded by the first material.

According to a favourable embodiment, the MEMS device is a probe.

This is a very important field of application for the method of the present invention. The sharp apex of the protrusion allows for more accurate measurements.

Finally, the present invention relates to a mold for manufacturing a MEMS device;
wherein said mold
defines a first side and a second side,
comprises a base substrate, wherein at the first side of the mold the surface of the base substrate defines a main plane parallel with the first side, said main plane defining a <111> plane of monocrystalline silicon, comprises a sacrificial layer on top of the base substrate at the first side of the mold, said sacrificial layer being chosen from polycrystalline silicon and amorphous silicon, and comprises a pit at the first side of the mold, said pit extending through the sacrificial layer into the base substrate, and comprising three wall sections parallel with <111> crystal planes, each of the three wall sections intersecting the other two wall sections, and comprising a vertex of a bottom section of the pit.

Such a mold is very useful for the method according to the invention. Typically a wafer will comprise a plurality of molds, and can be used in the method according to the invention.

The pit will extend from the first through the sacrificial layer into the base substrate.

According to a favourable embodiment, the sacrificial layer is at least partially covered by a molding layer with the molding layer forming the vertex of the pit.

Then the shape of the tip to be formed can be controlled to a larger extent than possible with just the sacrificial layer and/or the sacrificial layer can be chosen more for speed of separation and the molding layer can be chosen to better control the shape of the tip.

Figure 2D:
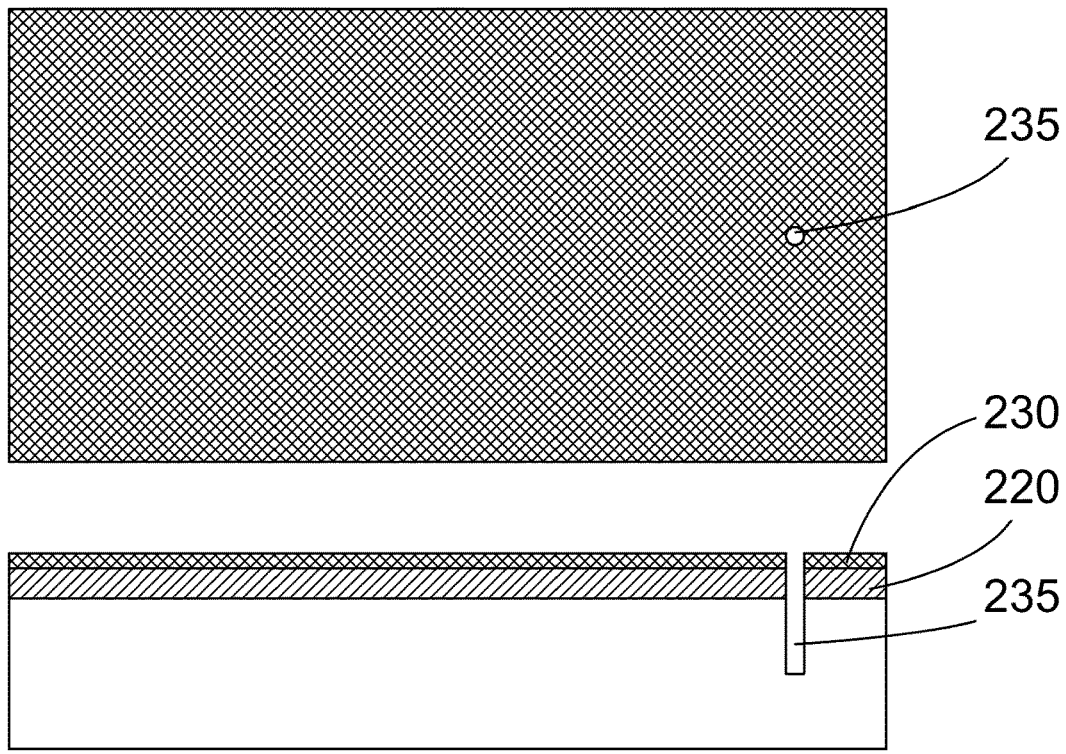
Figure 2E:
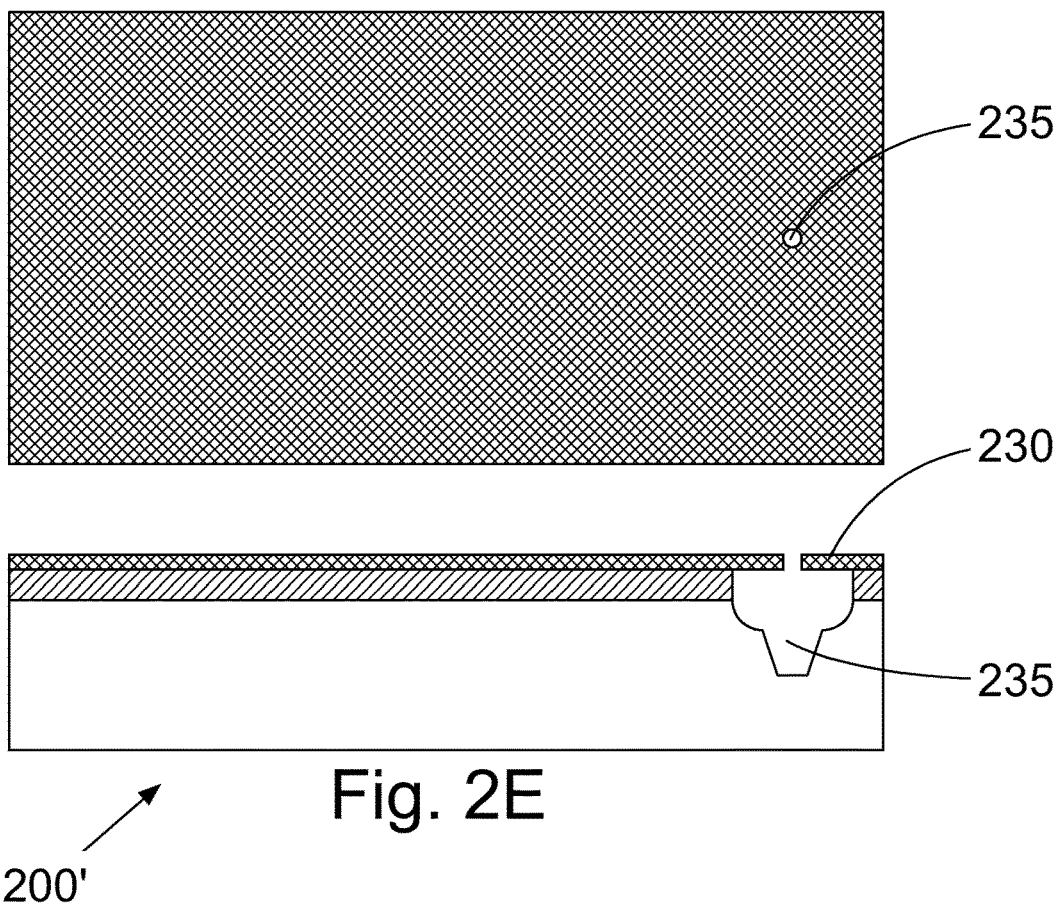
Figure 2F:
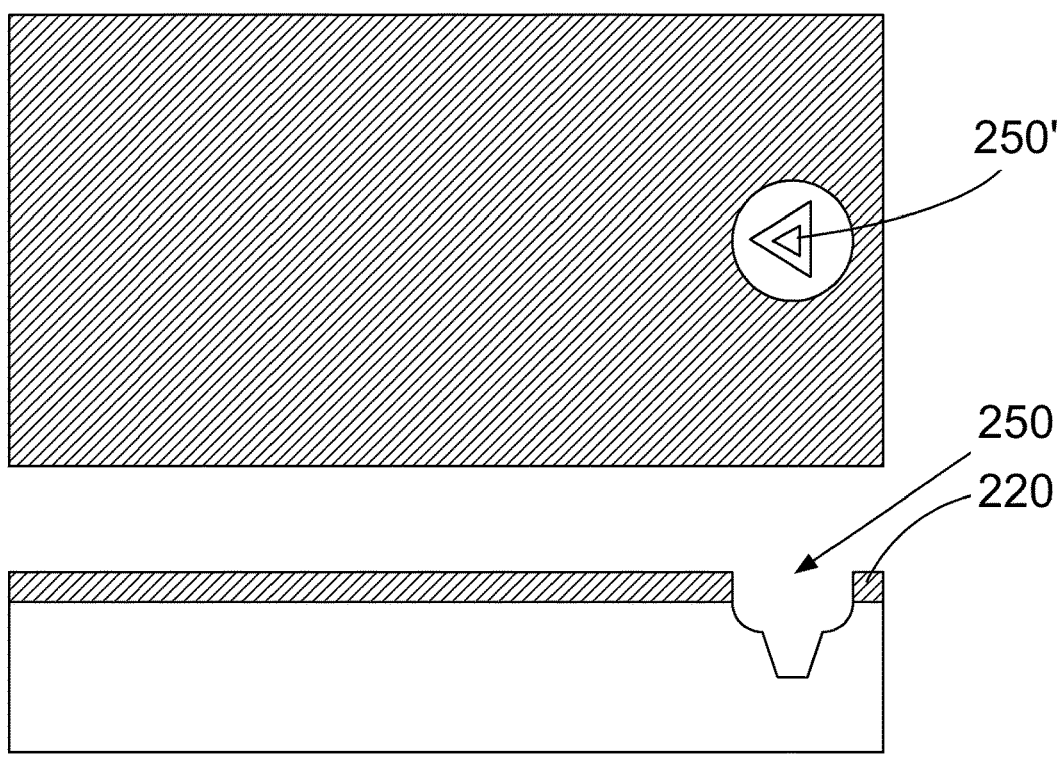
Figure 2G:
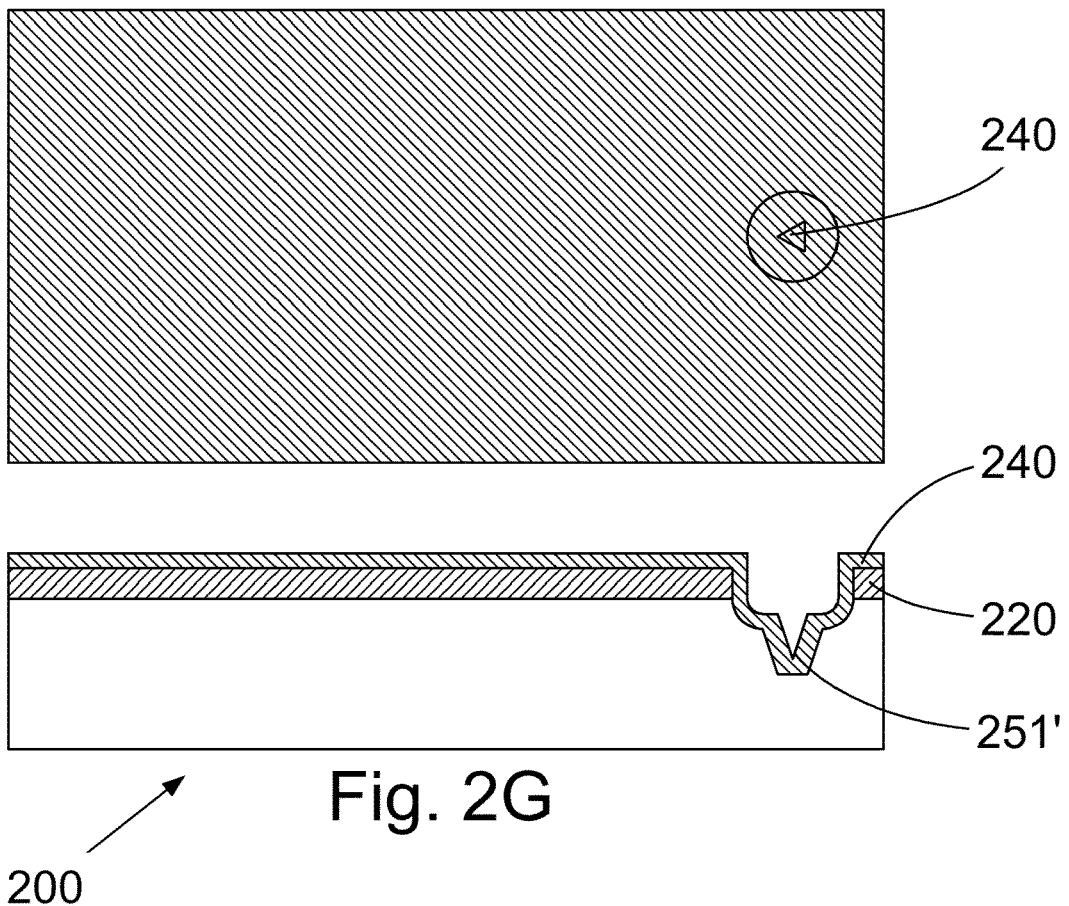
Figure 2H:
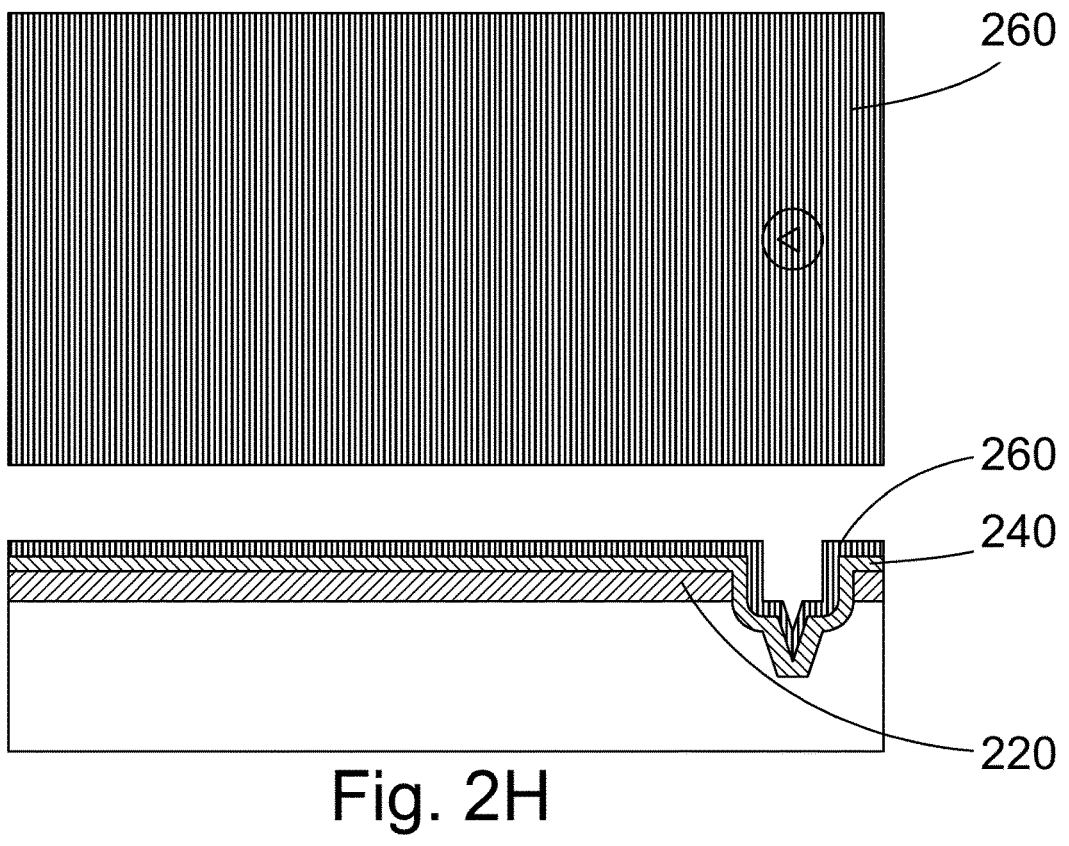
Figure 2I:
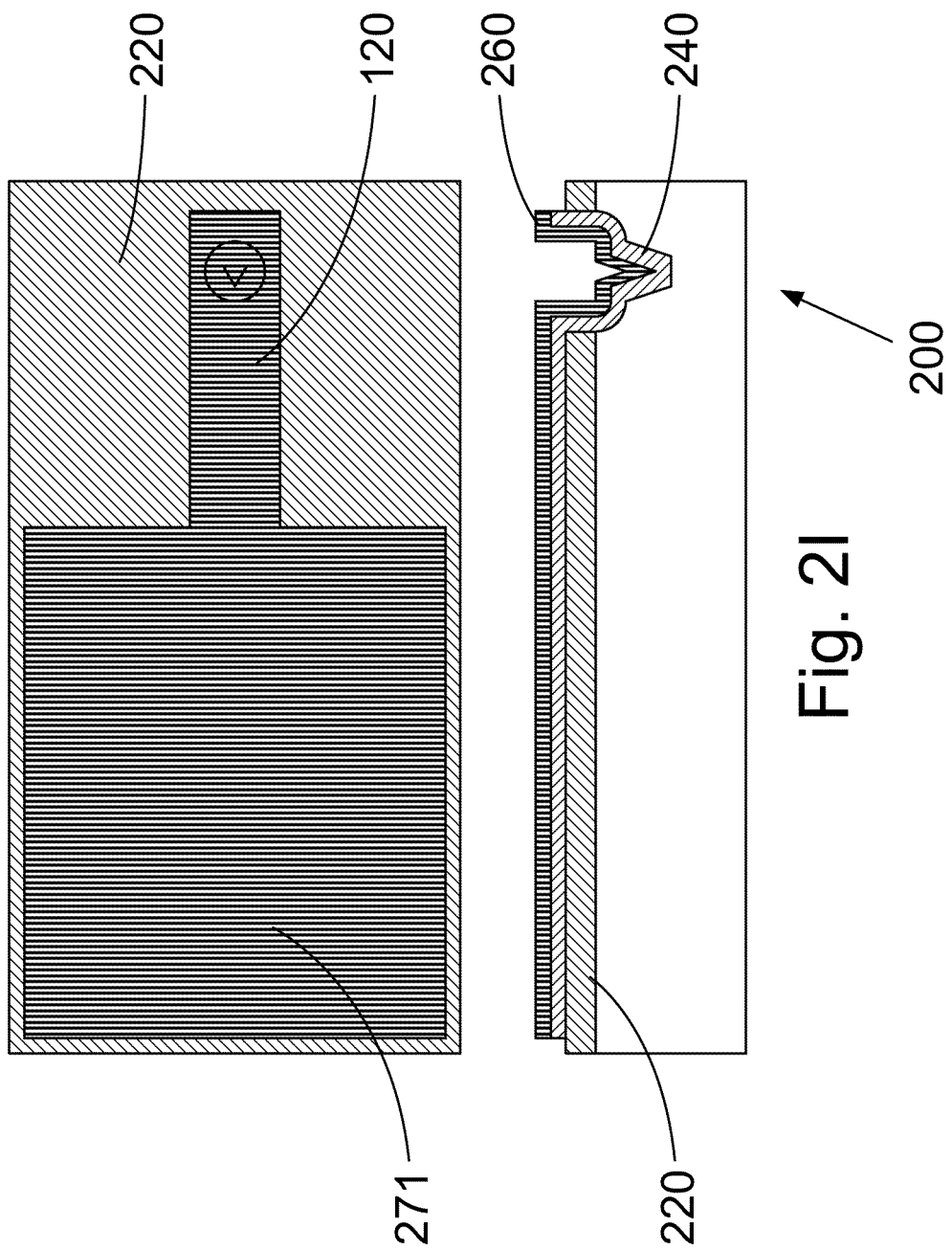
Figure 2J:
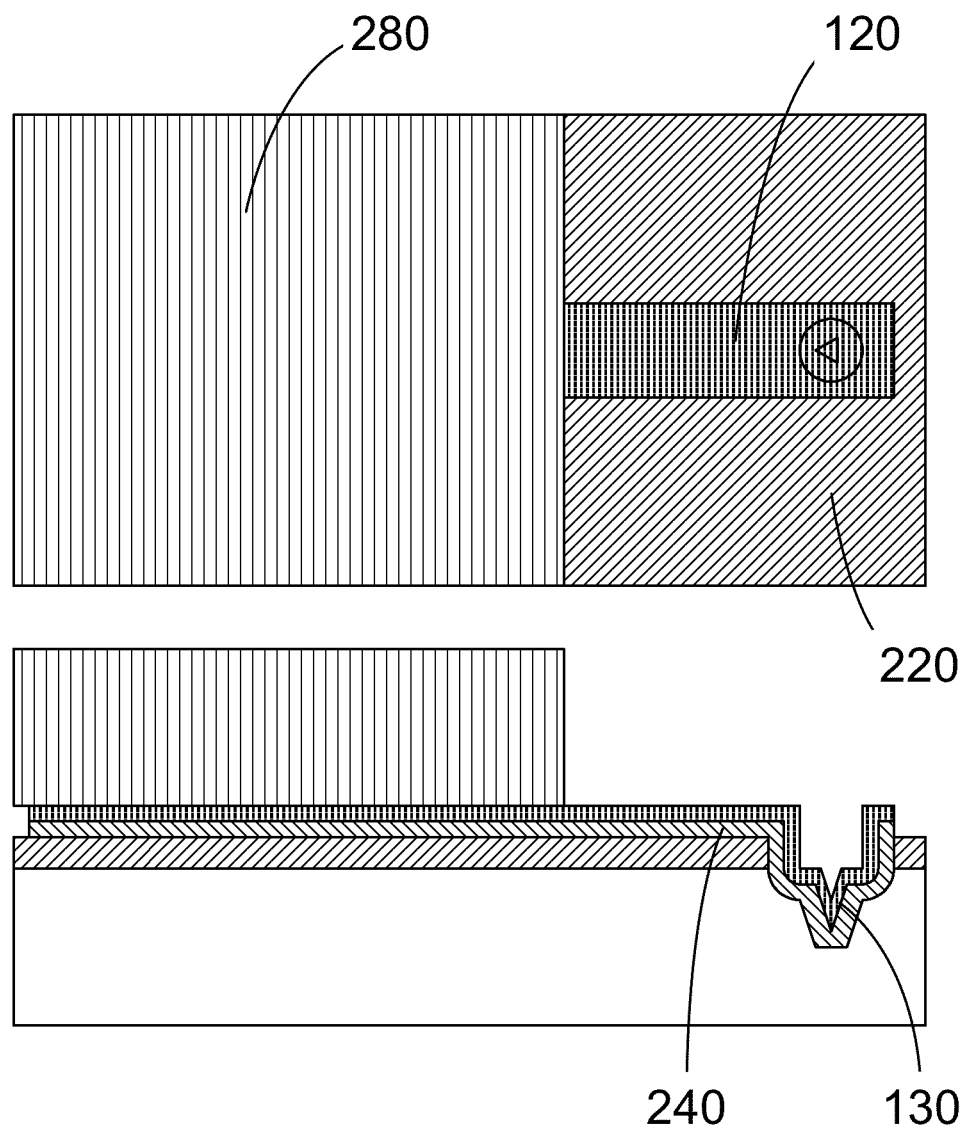
Figure 2K:
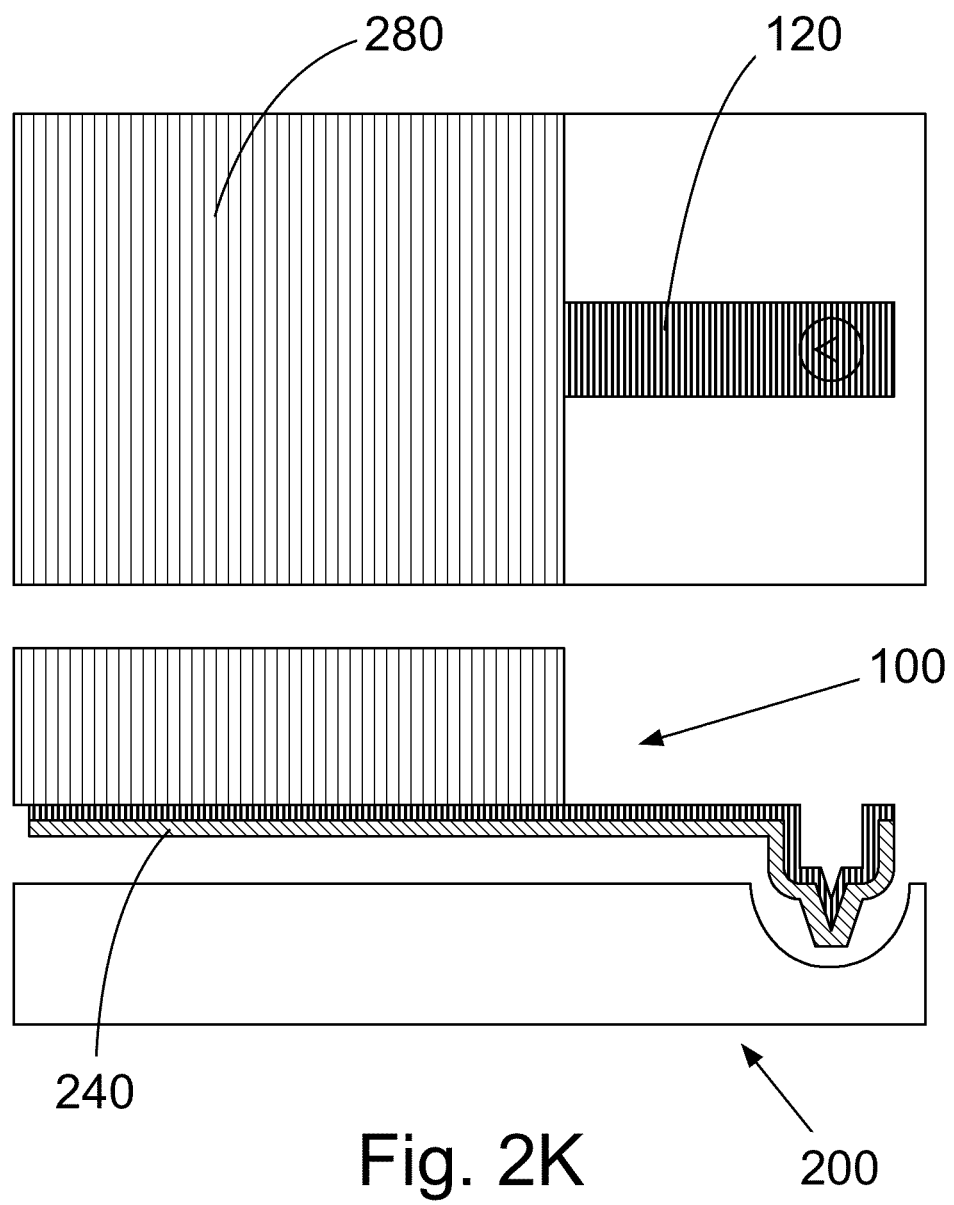
Figure 2L:
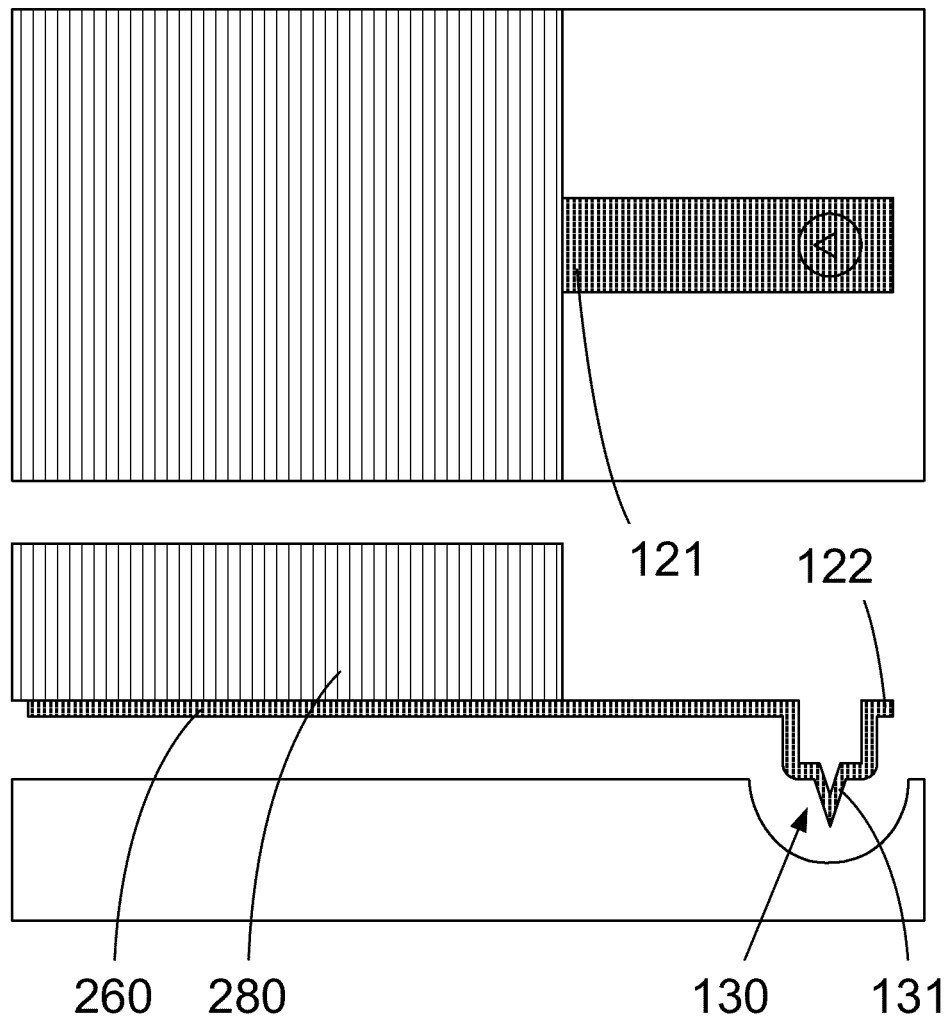
Figure 2M:
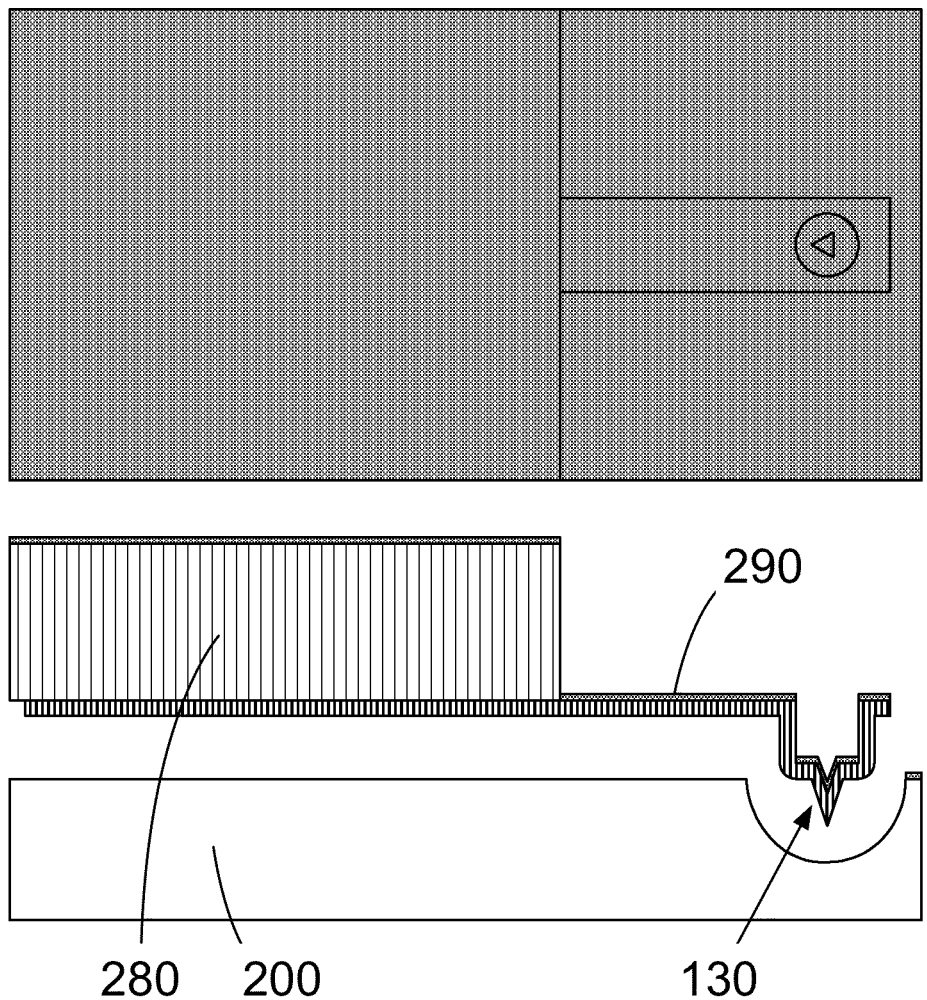
Figure 2N:
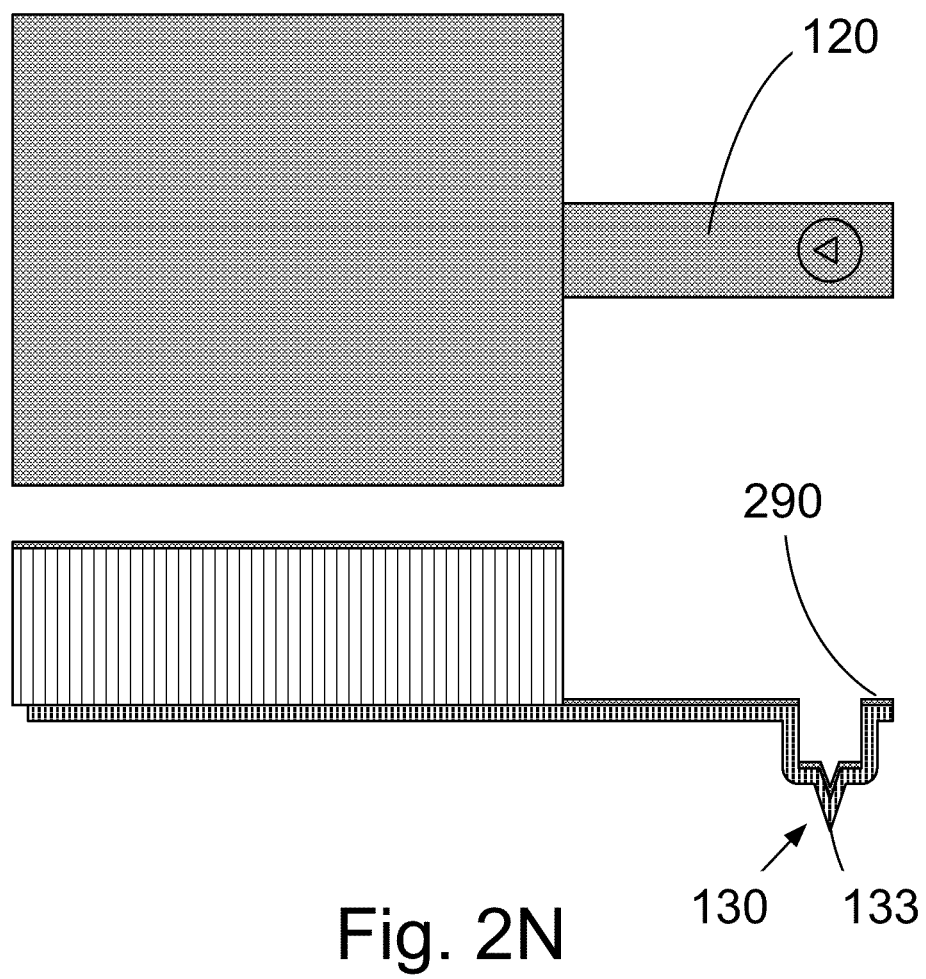

The present invention will now be illustrated with reference to the drawing where FIG. 1 shows a cross-sectional view of a MEMS device (probe);

FIG. 2A through FIG. 2N show a method of manufacturing the probe of FIG. 1; and

Figure 3:
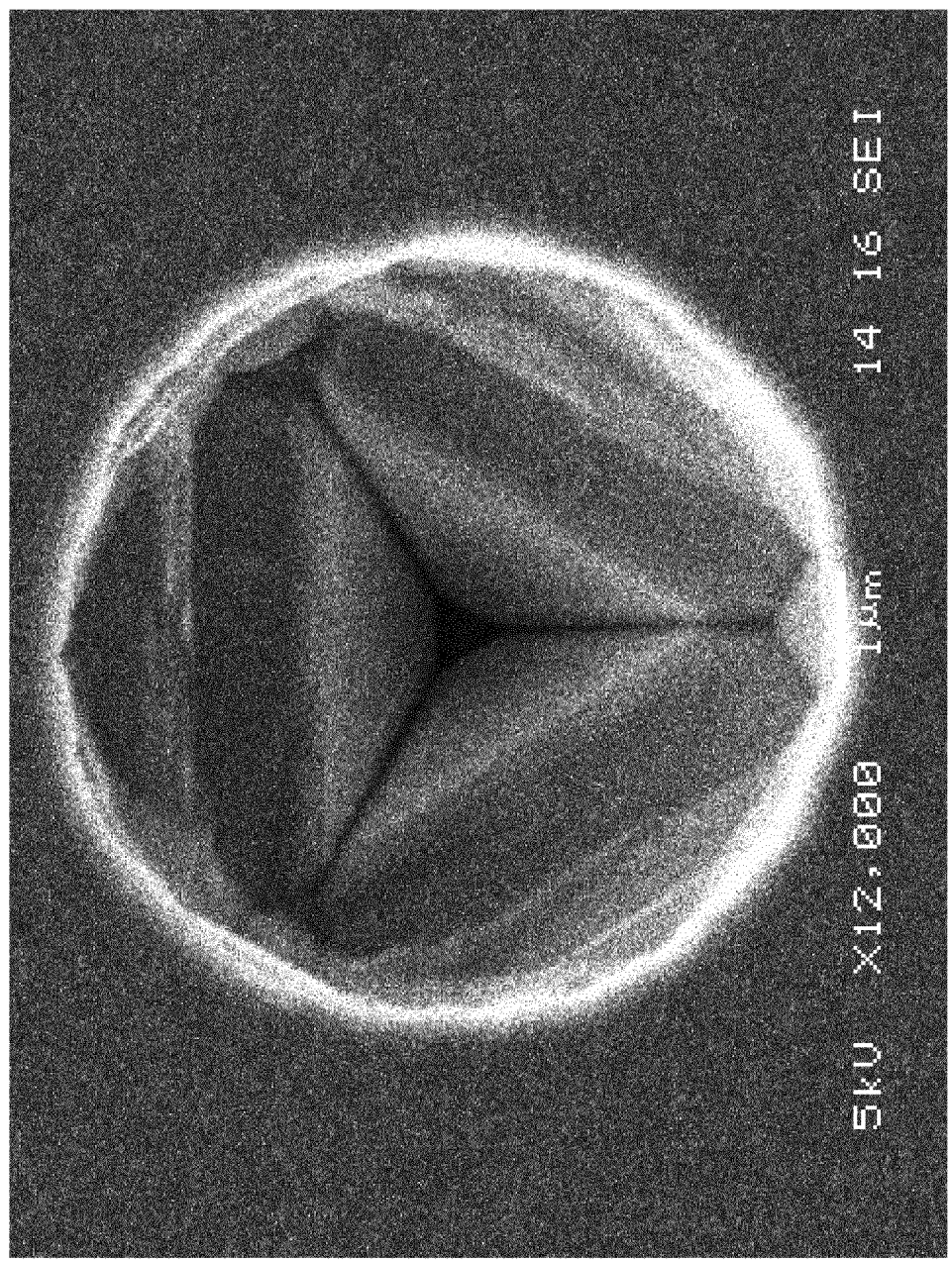

FIG. 3 Scanning electron microscope photo of a tip mold section of the tip mold of FIG. 2F.

FIG. 1 shows a cross-sectional view of a MEMS device 100, here a probe 100 comprising a probe body 110, a cantilever 120 with a proximal end 121 and a distal end 122, and at a distal end section a tip unit 130.

The tip unit 130 comprises a tip base 131 and a pyramidal tip 132 with an apex 133. The pyramidal tip 132 is a tetrahydral tip 132, i.e. it has three side planes meeting at the apex 133. The half-cone angle is 20°.

The method according to the invention will now be illustrated using FIG. 2A to FIG. 2N, wherein each figure shows a step both in top view and in cross-sectional view. The method steps demonstrate manufacturing of the probe 100 of FIG. 1.

The fabrication process starts with the manufacture of a mold 200, using a <111> silicon wafer 210 (FIG. 2A) as a starting material. Until the mold 200 is finished, the half-product of the mold is referred to as intermediate product 200'. The wafer 210 comprises a first main side 211 and a second main side 212.

On the wafer 210 a polycrystalline silicon (polysilicon) sacrificial layer 220 with a thickness of 1 um is deposited (FIG. 2B) using Low Pressure Chemical Vapor Deposition (LPCVD).

In general, when the thickness of the polysilicon layer is chosen the way that the molding layer will be deposited has to be taken into account. If the molding layer (silicon oxide) is thermally grown, the polysilicon layer will be consumed during the thermal oxidation process. The polysilicon layer has to be thick enough that after the thermal oxidation a part of the polysilicon layer remains on the wafer. A practical approach is starting with 1 um polysilicon and after the growing of around 1 um thick silicon oxide layer by thermal oxidation around 500 nm thick polysilicon remains on the wafer. This remaining layer is then used as the sacrificial layer for the MEMS probe release.

Subsequently a masking layer 230 is deposited (FIG. 2C). This layer serves to protect the polysilicon layer during the wet anisotropic etching of silicon, later on. In this embodiment silicon oxide is used as the masking layer, which was grown on the polysilicon sacrificial layer 220 using high-temperature thermal oxidation (wet oxidation at 1000° C. for 15 minutes, resulting in an $SiO_2$ layer of about 150 nm. An alternative method is to use the LPCVD deposition to deposit SiO2. An another option is to use silicon nitride as the masking layer. Both silicon oxide and silicon nitride are stable masking materials with respect to chemical etchants used for anisotropic etching of silicon (for example with KOH or TMAH) later on.

After the patterning of a circular opening by standard lithographical techniques (not shown in the Figures) a cylindrical hole 235 is created (FIG. 2D) by directional etching of the multilayer stack using a combination of Reactive Ion Etching (RIE) and Deep Reactive Ion Etching (DRIE). The dimensions of the cylindrical pit 235 (and the thickness of molding layer 240 which is discussed below) is a factor determining the height of the tip unit 130 (from cantilever 120 to apex 133). The cylindrical pit 235 at the bottom thereof is a factor determining the side length of the equilateral triangle of the triangular base of the pyramidal tip 132. During the anisotropic etching of silicon in a pit 235, a side of the triangle of the pyramidal tip 132 is determined when the furthermost <111> plane is reached. When this happens on all 3 sides an equilateral triangle is formed on the tip base 131. That means that the shape of the pit 235 does not need to be perfectly cylindrical to obtain an equilateral triangle. The angles between <111> planes are determined by the crystallographic structure of the monocrystalline silicon base material. <111> Planes of silicon are also etched in an anisotropic etchant (albeit much slower than other fast etching planes), for which reason the final length of the sides of the triangular base will not only be function of the initial shape of the cylindrical pit but also the anisotropic etching time.

After the directional etching of the cylindrical pit 235 the wafer was immersed in potassium hydroxide (KOH). KOH etches polysilicon isotopically, i.e. with the same etch rate in all directions. On the other hand, <111> silicon of the base material layer 110 is etched anisotopically. There the <111> planes are etched much slower than other crystallographic planes. In this way an tetrahedral tip unit mold 250 is formed (FIG. 2E).

The bottom section of the tip unit mold 250 is a tetrahedral mold section 250' that has very smooth walls. This bottom section of the tetrahedral mold is an equilateral triangle.

The simultaneous etching of the polysilicon sacrificial layer and the <111> silicon results in a wider top section of the tip unit mold 250 because the etch rate of the polysilicon is greater, allowing the <111> silicon of the base material to be etched from the first side where it doesn't follow a (111) crystal plane.

Other anisotropic etchants of silicon could be used to form the mold (for example TMAH).

The silicon oxide of the masking layer 230 that has protected the polysilicon layer 220 during the KOH etching is removed using concentrated HF (50% HF), leaving the polysilicon and <111> silicon base material.

Next, a silicon oxide molding layer 240 is conformally (i.e. having the same thickness irrespective of whether it is on a horizontal or inclined surface section) provided (FIG.

2G), be it by deposition by being grown, or both. The silicon oxide layer can be deposited by LPCVD (silicon oxide deposited from TetraEthyl OrthoSilicate, so called TEOS deposition) or grown by thermal oxidation. A combination of the TEOS deposition and thermal oxidation can be used as well. More information about the molding can be found in the PhD thesis of Vermeer (see chapter 3.3; supra). The silicon oxide layer has to be thick enough to completely refill the bottom of the bottom tip unit mold section 250' such that a tip unit mold vertex 251' is formed, which allows obtaining a sharp AFM tip 132. Now the mold 200 is ready for the manufacturing of a MEMS device.

After a mold 200 comprising a tip unit mold 250 with a sharp pit is created, a structural layer 260 is deposited (FIG. 2H) of protrusion material, in this embodiment silicon nitride deposited by LPCVD with a thickness of 600 nm.

The structural layer is patterned (FIG. 2I) to create the cantilever 120 and a cantilever base 271 using standard contact lithography in combination with RIE.

After the patterning, the silicon wafer is bonded to a pre-diced glass wafer 280 by anodic bonding (FIG. 2J).

Now the MEMS device has to be separated from (i.e. freed from) the base material of the mold 200.

To this end, the sacrificial polysilicon layer 220 underneath the cantilever 120 and the cantilever base 271 is removed using wet chemical etching (25 wt. % TMAH at 90° C. in this embodiment), which also etches the silicon base substrate around the tip unit 130. In this way the entire probe is released from the base material—i.e. most of the mold 200 is removed—without having to etch the base material completely away (FIG. 2K). This saves time, in particular so because <111> oriented silicon is slow to be etched, whether it is by wet etching or dry etching. To completely dissolve a 500 um thick (100) silicon wafer— which is done during the manufacture of MEMS devices having four-side pyramidal tips—requires about 8 hours of wet etching. The complete removal of <111> silicon wafer material is one hundred times slower and would therefore take in the order of 800 hours.

The released MEMS devices are still connected together because the glass substrate is not completely diced in certain directions (not shown in Figures), as is in itself known in the art. Also the edges of the silicon wafer are still connected with the glass substrate (not shown in Figures), because no sacrificial silicon layer was deposited there during the manufacture of the mold 200.

After release of the MEMS device from the mold 200, the silicon oxide molding layer 240 is removed (FIG. 2L) using buffered HF (BHF).

In this embodiment, the MEMS probe is metallized by deposition of a metal layer 290 (We use a Ti/Au bilayer as the reflective coating. The Ti layer is an adhesion layer with a thickness of 10 nm. The reflective gold layer is 50 nm thick). This metal layer 290 serves as a reflective layer on the cantilever 120 for the AFM imaging.

Alternatively, it is possible to deposit such a reflective layer earlier in the process (on top of the silicon nitride structural layer 260), at the expense of more processing steps for patterning. In either case a stack of sublayers is formed.

It is also possible to deposit a sublayer even earlier in the process, for example as a first sublayer on top of the molding layer 240. This will be done, for example, in case a protrusion has to be provided with the apex thereof being coated with a material that is different than the structural material of the cantilever, e.g. in case it is desired to have a tip coated with diamond.

Now the MEMS device 100 is ready for use and may be taken out by dicing. To reduce the risk of cantilevers breaking off, use is made of the known technique of applying a sticky foil (UV dicing foil) on the first main side. By removing the foil the MEMS probes are taken out. In this way all MEMS probes are transferred to the foil. By exposing the UV foil to UV light, the stickiness of the foil is reduced. After the exposure an individual MEMS probe can be picked up from the foil by using a pair of tweezers.

FIG. 3 is a Scanning Electron Microscope picture of the tip unit mold section 250' of the tip unit mold 250 after the removal of the masking layer (FIG. 2F) by KOH etching as seen from the first main side 211 towards the second main side 212. Centrally located are the three <111> planes defining the tip unit mold section 250', and around that the wider top section of the tip unit mold 250. At the first main side 211 the wider top section of the tip unit mold 250 has a (substantially) circular perimeter.

The invention claimed is:

1. A method of providing a MEMS device comprising a three-sided pyramidal protrusion using a multitude of MEMS method steps;
   wherein a mold is used, said mold
   defining a first side and a second side,
   comprising a base substrate, wherein at the first side of the mold the surface of the base substrate defines a main plane parallel with the first side, said main plane defining a <111> plane of monocrystalline silicon,
   comprising a sacrificial layer on top of the base substrate at the first side of the mold, said sacrificial layer being chosen from polycrystalline silicon and amorphous silicon;
   comprising a pit at the first side of the mold, said pit extending from the first side through a through-opening in the sacrificial layer into the base substrate, and
   comprising three wall sections parallel with <111> crystal planes, each of the three wall sections intersecting the other two wall sections, and
   comprising a vertex of a bottom section of the pit,
   wherein, when seen from the first side and in projection onto a plane substantially parallel to the main plane, the three wall sections are completely visible through the through-opening in the sacrificial layer;
   wherein the method of providing the MEMS device comprises
   providing an area at the first side of the mold which area extends from a first subarea outside the pit to a second subarea that comprises the vertex of the pit with a layer of protrusion material, such that part of the layer of protrusion material extends through the through-opening,
   patterning the layer of protrusion material to the desired shape, and
   isotropically etching the sacrificial layer of the mold with an isotropic etchant capable of etching the sacrificial layer so as to separate the MEMS device from at least the base substrate of the mold.

2. The method according to claim 1, wherein the mold is prepared by subjecting an intermediate product to a plurality of method steps to form a mold, the intermediate product defining a first side and a second side, and
   comprising a base substrate, wherein at the first side of the intermediate product the surface of the base substrate defines a main plane parallel with the first side, said main plane defining a <111> plane of monocrystalline silicon;

wherein the plurality of method steps comprises the steps of providing the base substrate of the intermediate product at the first side with a sacrificial layer of said first material, providing the sacrificial layer of the intermediate product with a masking layer of a second material different from the first material, providing the intermediate product with a blind hole extending from the first side into the base substrate, subjecting the intermediate product to anisotropic etching of the silicon using an etchant that is capable of etching the sacrificial layer in any direction parallel to the main plane at a rate that is at least as great as the rate of anisotropic etching of the <111> crystal planes of the silicon base material layer, so as to form a pit comprising three pyramidal wall sections, removing the masking layer of the second material, providing the pit of the intermediate product with a molding layer with the molding layer forming a vertex of the pit defined by the three wall sections so as to form the mold.

3. The method according to claim 2, wherein the step of providing the molding layer comprises growing the molding layer.

4. The method according to claim 2, wherein the step of subjecting the intermediate product to anisotropic etching of the silicon using an etchant that is capable of etching the sacrificial layer in any direction parallel to the main plane comprises etching at a rate that is greater than the rate of anisotropic etching of the <111> silicon base material layer so as to form the pit.

5. The method according to claim 2, wherein after separation of the MEMS device and the mold, the molding layer is removed by etching.

6. The method according to claim 2, wherein the masking layer is chosen from i) silicon nitride and ii) silicon oxide.

7. The method according to claim 1, wherein the layer of protrusion material comprises a material chosen from i) silicon nitride, and ii) diamond.

8. The method according to claim 1, wherein the layer of the protrusion material is formed as a stack of sublayers, wherein the method comprises providing a first sublayer of a first protrusion material followed by providing a second sublayer of a second protrusion material that is different from the first protrusion material.

9. The method according to claim 8, wherein the second sublayer is a metal.

10. The method according to claim 1, wherein the MEMS device is a probe.

11. The method according to claim 1, wherein the cross-sectional area of the pit at the first side is greater than or equal to the cross-sectional area of the pit in any plane between the first and second side and parallel to the main plane.

12. The method according to claim 1, wherein the layer of protrusion material in the pit is used to form an Atomic Force Microscopy, AFM, tip.

13. A mold for manufacturing a MEMS device;

wherein said mold defines a first side and a second side, comprises a base substrate, wherein at the first side of the mold the surface of the base substrate defines a main plane parallel with the first side, said main plane defining a <111> plane of monocrystalline silicon, comprises a sacrificial layer on top of the base substrate at the first side of the mold, said sacrificial layer being chosen from polycrystalline silicon and amorphous silicon, and comprises a pit at the first side of the mold, said pit extending through a through-opening in the sacrificial layer into the base substrate, and comprising three wall sections parallel with <111> crystal planes, each of the three wall sections intersecting the other two wall sections, and comprising a vertex of a bottom section of the pit, wherein, when seen from the first side and in projection onto a plane substantially parallel to the main plane, the three wall sections are completely visible through the through-opening in the sacrificial layer.

14. The mold according to claim 13, wherein the sacrificial layer is at least partially covered by a molding layer with the molding layer forming the vertex of the pit.

15. The mold according to claim 13, wherein the mold is a mold for forming an Atomic Force Microscopy, AFM, tip.

* * * * *